United States Patent
Ferreira et al.

(10) Patent No.: US 6,200,480 B1
(45) Date of Patent: *Mar. 13, 2001

(54) METHOD OF PURIFYING PHOTOACID GENERATORS FOR USE IN PHOTORESIST COMPOSITIONS

(75) Inventors: Lawrence Ferreira, Fall River; Sanjay Malik, Attleboro, both of MA (US)

(73) Assignee: Arch Specialty Chemicals, Inc., Norwalk, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,409

(22) Filed: Jan. 13, 1998

(51) Int. Cl.$^7$ .................................................. B01D 15/04
(52) U.S. Cl. ...................... 210/663; 210/683; 430/270.1
(58) Field of Search ................................... 210/683, 663, 210/767, 787, 800, 806; 430/270.1

(56) References Cited

U.S. PATENT DOCUMENTS

| 4,335,000 | * | 6/1982 | Grier et al. | 210/684 |
| 5,212,046 | * | 5/1993 | Lamola et al. | 430/270.1 |
| 5,350,714 | * | 9/1994 | Trefonas et al. | 210/660 |
| 5,446,125 | * | 8/1995 | Honda et al. | 528/486 |
| 5,472,616 | | 12/1995 | Szmanda et al. | 210/674 |
| 5,500,127 | | 3/1996 | Carey et al. | 210/685 |
| 5,518,628 | | 5/1996 | Carey et al. | 210/686 |
| 5,525,315 | | 6/1996 | Burke | 423/24 |
| 5,702,611 | * | 12/1997 | Gronbeck et al. | 210/688 |

\* cited by examiner

Primary Examiner—Ivars Cintins
(74) Attorney, Agent, or Firm—Ohlandt, Greeley, Ruggiero & Perle

(57) ABSTRACT

The present invention is directed to a process of removing trace acidic impurities from an impure solution of photoacid generating compounds in a solvent, comprising contacting an impure solution of at least one photoacid generating compound containing trace amounts of acidic impurities with an amine-containing ion exchange resin for a sufficient amount of time to remove substantially all of the acidic impurities from the impure solution, thereby producing a pure solution of at least one photoacid generating compounds substantially free of trace acidic impurities. The invention is also directed to a solution of at least one photoacid generating compound substantially free of trace acidic impurities made by the above process.

14 Claims, No Drawings

METHOD OF PURIFYING PHOTOACID GENERATORS FOR USE IN PHOTORESIST COMPOSITIONS

BACKGROUND OF THE INVENTION

1. Field of the Invention

The present invention relates to a process of removing trace levels of acidic impurities from a photoacid generator solution. In particular, the present invention is directed to a process of removing trace levels of acidic impurities from photoacid generator solutions by contacting the photoacid generating solution with an amine-containing ion exchange resin, as well as purified photoacid generator solutions made by the process.

2. Description of the Art

Photoresist compositions are used in microlithographic processes for making miniaturized electronic components such as in the fabrication of integrated circuits and printed wiring board circuitry. Generally in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, and X-ray radiant energy are radiation types commonly used today in microlithographic processes. After this image-wise exposure, the coated substrate is treated with a developer solution to dissolve and remove either the radiation-exposed or the unexposed area of the coated surface of the substrate.

Two types of photoresist compositions are generally used negative-working and positive-working. When negative-working photoresist compositions are exposed image-wise to radiation, the areas of the resist composition exposed to the radiation become less soluble to a developer solution (e.g., a crosslinking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution while those areas not exposed remain relatively insoluble to the developer solution. Thus, treatment of an exposed positive-working resist with the developer solution causes removal of the exposed areas of the resist coating and the creation of a positive image in the photoresist coating. Again, the desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Chemically amplified photoresists are commonly employed today in advanced lithographic processes and generally contain a photoacid generator (also known as PAGs), a polymer and, optionally, a dissolution inhibitor. Either the polymer or the dissolution inhibitor or both have acid-labile groups attached thereof. In such systems, the photogenerated acid causes removal of acid-labile protecting groups on the polymer and/or dissolution inhibitor. The solubility of the deprotected areas in aqueous alkaline solutions is much greater than the areas having the protect ed polymer or dissolution inhibitor. This change in solubility upon exposure to incident radiation is the basis for positive working chemically amplified photoresists.

While the photogeneration of acid is necessary for chemically amplified photoresist systems, the presence of trace amounts of acidic impurities in the initial photoresist may result in premature deprotection of the polymer and/or dissolution inhibitor. As a result, the presence of acidic impurities in photoacid generators adversely affects the shelf-life of the photoresist and the overall lithographic performance.

Traditionally, trace levels of acidic impurities have been removed from PAGs by water washing using two methods. One method generally involves exhaustively rinsing a solid PAG with deionized water. Another method involves forming a dilute solution of PAG in a water-immiscible solvent such as ethyl acetate, methylene chloride, chloroform and the like, and washing the PAG solution with water using extraction techniques. However, these methods are time-consuming and generate large volumes of aqueous and/or solvent waste which can be difficult to dispose.

The prior art also describes numerous techniques for reducing the amount of impurities in chemically amplified photoresist components. Some of these teachings include the following:

U.S. Pat. No. 5,472,616 issued Dec. 5, 1995 to Szmanda et al. and assigned to Shipley Company, claims a process for removing anionic contaminants from an organic solution containing a base-labile solute, comprising the steps of contacting the organic solution with an anion exchange resin that has had strong basic groups displaced by weaker anions having a basicity less than that of the hydroxyl anion for a time sufficient to remove essentially all anionic contaminants from solution.

U.S. Pat. No. 5,500,127 issued to Carey et al. on Mar. 19, 1996 and assigned to Rohm and Haas Co. discloses a method for removal of cationic and anionic contaminants from an organic solution of an acid catalyzed photoresist composition containing one or more acid labile components subject to reaction in the presence of a strong acid, the process comprising the steps of providing an organic solution containing one or more acid labile components, providing a weak acid cation exchange resin having a pKa such that the weak acid exchange groups on the resin do not react with acid labile components of the photoresist, providing a strong base anion exchange resin, and contacting the organic solution with the cation exchange resin and the anion exchange resin for a time sufficient to remove essentially all dissolved contaminants from solution without causing reaction between the acid labile components of the photoresist composition and the cation exchange resin.

U.S. Pat. No. 5,518,628 issued on May 21, 1996 to Carey and assigned to Shipley Company claims a process for removing ionic contaminants from an organic solution containing acid and base labile solutes, the process comprising the steps of providing a mixed bed of cation and anion exchange resins which has been treated by contact with an ammonium salt of a weak acid and contacting the organic solution with the treated bed of exchange resins for a sufficient time to remove essentially all ionic contaminants from the solution.

U.S. Pat. No. 5,525,315 issued to Burke on Jun. 11, 1996, and assigned to the Shipley Company, claims a process for removing heavy metal ions contained in an organic solution of one or more photoresist components, comprising the steps of washing a chelating cation exchange resin with an acid to remove essentially all sodium ions therefrom and rinsing the acid washed chelating cation exchange resin with water where the water effluent has a pH varying between 1 and 6, and contacting the organic solution containing heavy metal ions with the acid washed chelating cation exchange resin or a time sufficient to reduce the concentration of the heavy metal ions contained in the organic solution.

Reduction of acidic impurities from the photoacid generating component of today's advanced photoresist compositions is critical to their performance and shelf-life. Specifically, there is now a need to produce solutions of photoacid generators that contain less than 15 parts per million (ppm) of acidic impurities. The process of the present invention is an answer to that need.

BRIEF SUMMARY OF THE INVENTION

One aspect of the present invention is directed to a process of removing trace acidic impurities from an impure solution of photoacid generating compounds in a solvent, comprising: contacting an impure solution of at least one photoacid generating compound containing trace amounts of acidic impurities with an amine-containing ion exchange resin for a sufficient amount of time to remove substantially all of the acidic impurities from the impure solution, thereby producing a pure solution of at least one photoacid generating compounds substantially free of trace acidic impurities.

In another aspect, the invention relates to a solution of at least one photoacid generating compound substantially free of trace acidic impurities made by the above process.

These and other aspects will become apparent upon reading the following detailed description of the invention.

DESCRIPTION OF THE PREFERRED EMBODIMENTS

The term "photoacid generating compound" as defined herein refers to any photoacid generating compound conventionally used with photoresist compositions. Suitable photoacid generating compounds include onium salts, benzyl sulfonate esters, disulfones, iminosulfonates, and the like. Specific examples of photoacid generating compounds include, but are not limited to, the following:

(A) Triarylsulfonium photoacid generating compounds having the general formula (I):

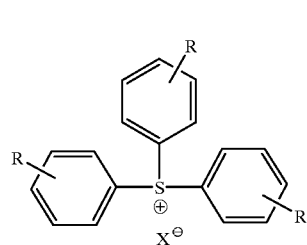

In formula (I), R can be H or an alkyl group, such as methyl, ethyl, propyl, butyl, and the like, or an alkoxy group, such as methoxy, ethoxy, propoxy, butyoxy, and the like.

(B) Alkylarylsulfonium photoacid generating compounds having the general formulae (II) or (III):

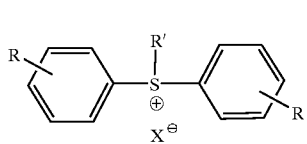

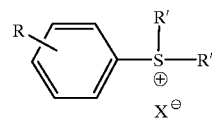

In formulae (II) and (III), R can be H or an alkyl group, such as methyl, ethyl propyl, butyl, and the like, or an alkoxy group, such as methoxy, ethoxy, propoxy, butyoxy, and the like; R' can be an alkyl group, such as methyl, ethyl propyl, butyl, and the like;

(C) Trialkylsulfonium photoacid generating compounds having the general formulae (IV):

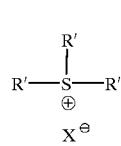

In formula (IV) R' can be an alkyl group, such as methyl, ethyl propyl, butyl, and the like;

(D) Diaryliodonium photoacid generating compounds having the general formulae (V):

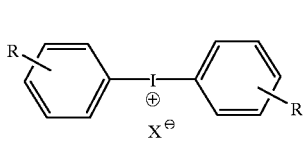

In formula (V) R can be H or an alkyl group, such as methyl, ethyl propyl, butyl, and the like, or an alkoxy group, such as methoxy, ethoxy, propoxy, butyoxy, and the like;

(E) Benzylsulfonate ester compounds such as 2-nitro-6-(trifluoromethyl)benzyl-4-methoxybenzene sulfonate;

(F) Disulfone compounds such as diphenyldisulfone; and (G) Iminosulfonate compounds.

The counterion (X⁻) in any of the above-noted PAGs described above may be any acceptable counterion, for example $SbF_6^-$, $PF_6^-$, $AsF_6^-$, $BF_4^-$, triflate ($CF_3SO_3^-$), alkyl sulfonate, substituted or unsubstituted benzenesulfonate, dodecylbenzenesulfonate, camphorsulfonate, cyclohexylsulfonate, nitrobenzenesulfonate, and the like.

Particularly suitable PAGs useful according to the method of the invention include triphenylsulfonium triflate, triphenylsulfonium dodecylbenzenesulfonate, triphenylsulfonium-10-camphorsulfonate, triphenylsulfonium cyclohexylsulfonate, diphenyliodonium-4-methoxybenzenesulfonate, di(t-butylphenyl)iodonium-4-methoxybenzenesulfonate, bis(tert-butylphenyl)iodonium 10-camphorsulfonate, bis(tert-butylphenyl)iodonium cyclohexylsulfonate, bis(tert-butylphenyl)iodonium dodecylbenzenesulfonate, bis(tert-butylphenyl)iodonium methanesulfonate, bis(tert-butylphenyl)iodonium triflate, diphenyliodonium 10-camphorsulfonate, diphenyliodonium cyclohexylsulfonate, diphenyliodonium dodecylbenzenesulfonate, diphenyliodonium methanesulfonate, diphenyliodonium triflate, triphenylsulfonium 10-camphorsulfonate, triphenylsulfonium 2,4,6-triisopropylbenzenesulfonate, triphenylsulfonium 4-methoxybenzenesulfonate, triphenylsulfonium methanesulfonate, tris(tert-butylphenyl)sulfonium 10-camphorsulfonate, tris(tert-butylphenyl)sulfonium 2,4,6-triisopropylbenzenesulforate, tris(tert-butylphenyl) sulfonium 4-methoxybenzenesulfonate, tris(tert-butylphenyl)sulfonium cyclohexylsulfonate, tris(tert-butylphenyl)sulfonium dodecylbenzenesulfonate and tris (tert-butylphenyl)sulfonium methanesulfonate. Any of the above photoacid generating compounds may be used alone or in any combination in the process of the present invention.

As used herein, the term "trace acidic impurities" refers to any acidic compound found in a solution of photoacid generating compounds in an undesirable amount, preferably greater than 15 parts per million (ppm). The phrase "impure solution" refers to photoacid generator solutions containing undesirable amounts of trace acidic impurities, preferably at levels greater than about 15 ppm. The phrase "substantially free of trace acidic impurities" refers to photoacid generating solutions that contain acceptable amounts of trace acidic impurities, preferably less than 15 ppm. The phrase "pure solution" refers to photoacid generator solutions that contain acceptable amounts of trace acidic impurities, preferably less than 15 ppm.

According to the process of the present invention, an impure solution of at least one photoacid generating compound in a solvent is contacted with an amine-containing ion exchange resin to remove trace acidic impurities. Preferably, this impure solution is prepared by dissolving one or more photoacid generating compounds in a suitable solvent or solvent mixture; however, other methods of making the impure solution are known in the art. Solvents useful for dissolution of the photoacid generating compounds include any solvent used conventionally in the preparation of photoresist component solutions. Examples of such solvents include ethyl lactate, ethyl-3-ethoxypropionate (EEP), propylene glycol monomethyl ether acetate (PGMEA), methyl-3-methoxypropionate (MMP), 2-heptanone, diacetone alcohol, ethylene glycol monoethyl ether acetate, acetone, methanol, butanol, isopropanol, methylene chloride, chloroform, 2-butanone, and ethyl acetate, and the like. It will be appreciated by those skilled in the art that these solvents may be used in the present invention either alone or in any combination.

The solid PAG content of the resulting impure photoacid generator solution is not critical. Preferably, the amount of solid PAG may be from about 0.1% to about 25%, or higher, by weight; more preferably from about 1% to about 10% by weight; based on the total photoacid generator solution weight.

While it is preferred to use a single photoacid generating compound in solution as the material being treated by the method of the present process, it is contemplated within the scope of the present invention that combinations of photoacid generating compounds in solution may be treated.

As a general observation, the sources of trace acidic impurities in solutions of photoacid generating compounds are thought to be the result of (1) unreacted acids that are not removed after synthesis of the photoacid generating compound; (2) decomposition of the photoacid generating compound over time or upon exposure to light or heat; and (3) acidic impurities present in the solvents of the photoacid generating solution. However, it is understood that the trace acidic impurities that are present in the photoacid genenerating solution may be from any source.

The type of acidic impurities present in the photoacid generating solution depends on the source of the impurities. For example, acidic impurities resulting from decomposition of the photoacid generating compound or synthesis of the photoacid generating compound are the corresponding acid (e.g., sulfonic acid). Alternatively, acidic impurities present in the solvents may be any acid soluble in the solvent (e.g. HCl, $H_2SO_4$, lactic acid, acetic acid or substituted propionic acid and the like). Generally, trace acidic impurities in the PAG solution at levels greater than about 15 ppm adversely affect the performance and shelf-life of the photoresist solution.

The impure photoacid generator solution may be made in any conventional method of mixing a solid photoacid generator with a solvent. Generally, it is preferred that the solid photoacid generating compound is added to a sufficient amount of solvent so that the solid photoacid generating compound is dissolved in the solvent. This step may be facilitated by agitation or other conventional mixing means.

According to the process of the present invention, the impure photoacid generator solution is contacted with an amine-containing ion exchange resin to remove the trace acidic impurities present in the impure PAG solution. The term "amine-containing ion exchange resin" refers to anionic resins that contain an amine group. Preferably, the amine-containing ion exchange resin is a highly porous structure based on polystyrene crosslinked with divinylbenzene and contains pendant polyamine functional groups. Particularly suitable amine-containing ion exchange resins include polyvinylpyridine, DIANION CR-20 (diethenyl benzene polymer with N-(2-aminethyl)-N-[(ethenyl-phenyl) methyl]-1,2-ethanediamine) (a particulate chelate resin with a cross-linked styrene-divinyl benzene copolymer bead having polyamine functional chelating groups and an average 1.2 micron particle diameter) available from Mitsubishi Kasei of Tokyo, Japan; and other macroreticular, weakly basic anion exchange resins such as AMBERLYST A-21 (styrene sulfonic acid-divinyl benzene cation exchange resin) available from Rohm and Haas.

The photoacid generating solution may be contacted with the amine-containing ion exchange resin by any method known in the art, such as a column, or more preferably, batch techniques. Preferably, a sufficient amount of aminecontaining ion exchange resin is contacted with the PAG solution so that the PAG solution is substantially free of trace acidic impurities when the contacting step is complete. Typically, the amount of amine-containing ion exchange resin will range from about 0.5 wt % to about 50 wt %, more preferably about 1 wt % to about 25 wt %, and most preferably 1 wt % to about 10 wt %, all based on the total amount of solids in the PAG solution. The contacting treatment is usually conducted at room temperature with agitation.

The impure photoacid generator solution is preferably contacted with the amine-containing ion exchange resin for a sufficient amount of time so that the acid photoacid generating solution is substantially free of trace acidic impurities. Generally, the preferred contacting time for contacting the impure photoacid generator solution with the amine-containing ion exchange resin by a batch mixing or rolling technique is from about 1 hour to about 24 hours, more preferably from about 2 hours to about 22 hours, and most preferably from about 4 hours to about 20 hours.

Following contacting, the amine-containing ion exchange resin is next removed from the photoacid generating solution. Removal of the amine-containing ion exchange resin from the photoacid generating solution may be performed by any conventional procedure known in the chemical arts. Preferably, the amine-containing ion exchange resin is removed from the photoacid generating solution by gravity filtration, vacuum filtration, decantation, and centrifugation and the like.

Through the utilization of the present process, trace acidic impurities in the photoacid generator solution are reduced to below 15 ppm, preferably below 10 ppm.

Accordingly, pure resist component solutions such as PAG solutions can be prepared by the present process, which have an amount of acidic impurities under about 15 ppm. Preferably, the PAG solutions have an amount of acidic impurities under about 10 ppm.

The present invention is further described in detail by means of the following examples. However, this invention is not intended to be limited by these examples. All parts and percentages are shown by weight percent, and all temperatures are in degrees Celsius, unless explicitly stated otherwise.

The Examples below refer to a Neutral Red Test. This test is described as follows:

Neutral Red Test

1. Purification of Neutral Red 11.56 g of Neutral Red Hydrochloride (CAS # 553-24-2, Aldrich Catalog #86,125-1) was weighed into a 500 mL amber bottle equipped with a liquid-tight screw cap, and 400 mL of absolute ethanol was added. The bottle was placed on a roller for at least two hours, and then 40 mL of 1.0 N NaOH were added. The bottle was then replaced on the roller for at least one hour. The slurry was filtered, and the resulting liquor was added to 4.0 L of deionized water heavily agitated. The resulting solids were collected by filtration and allowed to air dry.

The dry crystals of crude Neutral Red were placed in another 500-mL amber bottle and 400 mL more of absolute ethanol were added. The bottle was rolled for at least 2 hours, 40 mL of 1.0N NaOH was added and the bottle was allowed to roll again for at least one hour. The slurry was filtered, and the liquid was added to 4.0 L of heavily agitated deionized water. The bright red/orange precipitate that formed was collected by filtration and dried in vacuum at 40° C. until no weight change was observed (at least overnight).

Yield of crystals was 2-3 g.

2. Preparation of Neutral Red Reagent

Purified Neutral Red Crystals as prepared above (6.25 mg.) were weighted into a 250 ml volumetric flask. Sufficient tetrahydrofuran (THF) to fill to the volumetric mark was added. The flask was then shaken to dissolve. The resulting solution was yellow in color, indicating no acid contamination.

3. Test of Purified PAG Solution

A purified photoacid generator solution of either Example 1, 2 or 3 below (400 mg.) was added to a 25 ml volumetric flask. Then, the Neutral Red Reagent (4 ml) as prepared above was added to the flask. This was then diluted to 25 ml with tetrahydrofuran (THF). The flask was shaken and the color of the contents observed. If the color did not change from yellow, then this indicated that the amount of acidic impurities in the PAG solution was less than 10 ppm. If the color did change to red or orange, then this indicated that the amount of acidic impurities in the PAG solution was greater than 10 ppm.

EXAMPLE 1

Treatment of Nitrobenzyl Sulfonate.

To a 5 gallon plastic container was added 800.5 grams of (2-trifluoromethyl-6-nitrophenyl)methyl-4-methoxybenzenesulfonate, 15,209.5 grams of propylene glycol monomethyl ether acetate (PGMEA), and 40 grams of DIANION™ CR-20 (diethenyl benzene polymer with N-(2-aminethyl)-N-[(ethenyl-phenyl)methyl]-1,2-ethanediamine) as the aminecontaining ion exchange resin. This mixture was rolled at about 38 rpm for 19 hours. Following rolling, the solid ion exchange resin was removed from the solution by pressure filtration. The filtrate was evaluated for the presence of residual acidic compounds by the above-noted Neutral Red test, which gave a negative result, indicating less than 10 ppm acidic compounds in the filtrate solution.

EXAMPLE 2

Treatment of Bis(4-tert-butylphenyl) iodonium-4-methoxybenzenesulfonate.

To an amber glass bottle was added 2.5 grams of bis(4-tert-butylphenyl)iodonium-4-methoxybenzenesulfonate, 50 ml of isopropanol, and 1 gram DIANION™ CR-20 as the amine-containing ion exchange resin. This mixture was rolled at 200 rpm for about 15–18 hours. Following this agitation, the solid ion exchange resin was removed from the solution by decantation, and the filtrate was evaluated for the presence of residual acidic compounds by the above-noted Neutral Red test. This test gave a negative result, indicating less than 10 ppm of acidic compounds were present in the solution.

EXAMPLE 3

Treatment of Triphenylsulfonium Dodecylbenzenesulfonate.

To an amber glass bottle was added 60.72 grams of triphenylsulfonium dodecylbenzenesulfonate, 850 ml of isopropanol, and 31.47 grams of DIANION™ CR-20 as the amine-containing ion exchange resin. This mixture was rolled at 180 rpm for 15–18 hours. Following this agitation, the solid ion exchange resin was removed from the solution by decantation, and the filtrate was evaluated for the presence of residual acidic compounds by Neutral Red test. The filtrate returned a negative result indicating less than 10 ppm acidic compounds present in the filtrate solution.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process of removing trace acidic impurities from an impure solution of photoacid generating compounds in a solvent, consisting of contacting an impure solution of at least one photoacid generating compound containing trace amounts of acidic impurities with an ion exchange resin consisting of anionic ion exchange resin containing pendent polyamine functional groups for a sufficient amount of time to remove substantially all of said acidic impurities from said impure solution, and removing the resin from the solution thereby producing a pure solution of at least one photoacid generating compounds substantially free of trace acidic impurities.

2. The process of claim 1, wherein said photoacid generating compound is selected from the group consisting of onium salts, benzyl sulfonate esters, disulfones, iminosulfonates, and combinations thereof.

3. The process of claim 2, wherein said photoacid generating compound is selected from the group consisting of triphenylsulfonium triflate, triphenylsulfonium dodecylbenzenesulfonate, triphenylsulfonium-10-camphorsulfonate, triphenylsulfonium cyclohexylsulfonate, diphenyliodonium-4-methoxybenzenesulfonate, di(t-butylphenyl)iodonium-4-methoxybenzenesulfonate, bis(tert-butylphenyl)iodonium 10-camphorsulfonate, bis(tert-butylphenyl)iodonium cyclohexylsulfonate, bis(tert-butylphenyl)iodonium dodecylbenzenesulfonate, bis(tert-butylphenyl)iodonium methanesulfonate, bis(tert-butylphenyl)iodonium triflate, diphenyliodonium 10-camphorsulfonate, diphenyliodonium cyclohexylsulfonate, diphenyliodonium dodecylbenzenesulfonate, diphenyliodonium methanesulfonate, diphenyliodonium triflate, triphenylsulfonium 10-camphorsulfonate, triphenylsulfonium 2,4,6-triisopropylbenzenesulfonate, triphenylsulfonium 4-methoxybenzenesulfonate, triphenylsulfonium methanesulfonate, tris-(tert-butylphenyl)sulfonium 10-camphorsulfonate, tris(tert-butylphenyl)sulfonium 2,4,6-triisopropylbenzenesulfonate, tris(tert-butylphenyl) sulfonium 4-methoxybenzenesulfonate, tris(tert-butylphenyl)sulfonium cyclohexylsulfonate, tris(tert-butylphenyl)sulfonium dodecylbenzenesulfonate and tris (tert-butylphenyl)sulfonium methanesulfonate.

4. The process of claim 1, wherein said solvent is selected from the group consisting of ethyl lactate, ethyl-3-ethoxypropionate, propylene glycol monomethyl ether acetate, methyl-3-methoxypropionate, 2-heptanone, diacetone alcohol, ethylene glycol monoethyl ether acetate, acetone, methanol, butanol, isopropanol, methylene chloride, chloroform, 2-butanone, and ethyl acetate and combinations thereof.

5. The process of claim 1, wherein said ion exchange resin is a diethenyl benzene polymer with N-(2-aminethyl)-N-(ethenyl-phenyl)methyl-1,2-ethanediamine.

6. The process of claim 1, wherein said impure solution is contacted with said ion exchange resin from about 1 hour to about 24 hours.

7. The process of claim 1, wherein said impure solution is contacted with said ion exchange resin from about 2 hours to about 22 hours.

8. The process of claim 1, wherein said impure solution is contacted with said ion exchange resin from about 4 hours to about 20 hours.

9. The process of claim 1, wherein the amount of said ion exchange resin in said contacting step is from about 0.5 wt % to about 50 wt %, based on the total amount of solids in said impure solution.

10. The process of claim 1, wherein the amount of said ion exchange resin in said contacting step is from about 1 wt % to about 25 wt %, based on the total amount of solids in said impure solution.

11. The process of claim 1, wherein the amount of said ion exchange resin in said contacting step is from about 1 wt % to about 10 wt %, based on the total amount of solids in said impure solution.

12. The process of claim 1, wherein said pure solution contains less than 15 ppm of acidic impurities.

13. The process of claim 1, wherein said pure solution contains less than 10 ppm of acidic impurities.

14. The process of claim 1, wherein said ion exchange resin is removed from said solution by a process selected from the group consisting of gravity filtration, vacuum filtration, decantation, and centrifugation.

* * * * *